(12) United States Patent
Tanahashi et al.

(10) Patent No.: US 7,378,912 B2
(45) Date of Patent: May 27, 2008

(54) CASCODE CONNECTION CIRCUIT

(75) Inventors: Naoki Tanahashi, Tokyo (JP); Akira Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 117 days.

(21) Appl. No.: 11/437,678

(22) Filed: May 22, 2006

(65) Prior Publication Data

US 2007/0046379 A1    Mar. 1, 2007

(30) Foreign Application Priority Data

Aug. 26, 2005    (JP)    ............................. 2005-245251

(51) Int. Cl.
*H03F 1/22*    (2006.01)
(52) U.S. Cl. ...................................... 330/311
(58) Field of Classification Search ............... 330/302, 330/311
See application file for complete search history.

(56) References Cited

U.S. PATENT DOCUMENTS 6,864,750 B2 *    3/2005    Shigematsu ................. 330/311

2005/0007200 A1    1/2005    Inoue et al.

FOREIGN PATENT DOCUMENTS

| JP | 2005-027181 | 1/2005 |
|---|---|---|
| JP | 2005-033650 | 2/2005 |

\* cited by examiner

*Primary Examiner*—Steven J Mottola
(74) *Attorney, Agent, or Firm*—Leydig, Voit & Mayer, Ltd.

(57) ABSTRACT

A cascode connection circuit includes a first field effect transistor (FET) which has a source terminal and a drain terminal, the source terminal being connected to ground; a second FET which has a source terminal and a gate terminal, the source terminal being connected to the drain terminal of the first FET; and a first resistor and a first capacitor connected in series between the source terminal of the first FET and the gate terminal of the second FET. The first FET and the second FET are cascode-connected to each other. The product of the resistance of the first resistor and the capacitance of the first capacitor does not exceed 0.1 times the period of an operating frequency of the circuit.

10 Claims, 12 Drawing Sheets

CASCODE CONNECTION CIRCUIT

BACKGROUND OF THE INVENTION

1. Field of the Invention

The present invention relates to a cascode connection circuit used mainly in a high frequency band of 800 MHz or more.

2. Background Art

Cascode connection circuit having two field effect transistors (hereinafter referred to as a "FET") cascode-connected to each other is used in a high frequency amplifier circuit used mainly in a high frequency band of 800 MHz or more.

FIG. 14 is a circuit diagram showing a conventional cascode connection circuit. As shown in FIG. 14, the conventional cascode connection circuit comprises FET1 having a source terminal connected to the ground, FET2 having a source terminal connected to a drain terminal of FET1, a capacitor 3 connected between the source terminal of FET1 and a gate terminal of FET2, a resistor 4 connected between a drain terminal of FET2 and the gate terminal of FET2, and a resistor 5 connected in parallel to the capacitor 3, between the source terminal of FET1 and the gate terminal of FET2 (refer to Japanese Patent Laid-Open No. 2005-33650, for example).

However, when capacitance C1 of the capacitor 3 is determined so that drain/source voltage Vds of FET1 and that of FET2 have the same phase and amplitude of alternate current, then a frequency region having a negative resistance emerges in the output side impedance of the cascode connection circuit. Thus, an oscillation tends to occur, causing a problem.

SUMMARY OF THE INVENTION

To solve the above problem, the present invention has been devised, and has an object to obtain a cascode connection circuit capable of improving operational stability without deteriorating gain, output power and efficiency.

According to one aspect of the present invention, a cascode connection circuit includes a first field effect transistor (hereinafter referred to as an "FET") which has a source terminal connected to the ground; a second FET which has a source terminal connected to a drain terminal of the first FET; and a first resistor and a first capacitor connected in series between the source terminal of the first FET and a gate terminal of the second FET. The first FET and the second FET are cascode-connected to each other. A product of a resistance value of the first resistor and a capacitance value of the first capacitor is 0.1 times or less of a period corresponding to an operating frequency.

Other and further objects, features and advantages of the invention will appear more fully from the following description.

According to the present invention, operational stability can be improved without deteriorating gain, output power and efficiency.

DETAILED DESCRIPTION OF THE PREFERRED EMBODIMENTS

First Embodiment

An embodiment of the present invention will be described with reference to the accompanying drawings.

Figure 1:
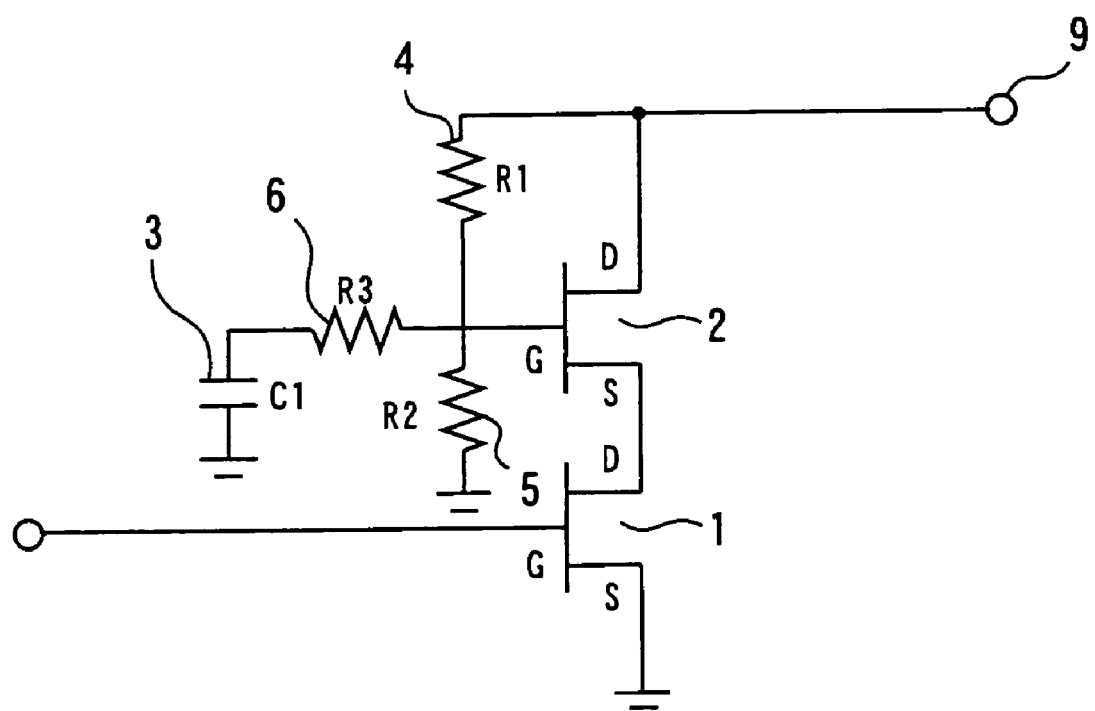
FIG. 1 is a circuit diagram showing a cascode connection circuit according to First Embodiment of the present invention.

FIG. 1 is a circuit diagram showing a cascode connection circuit according to First Embodiment of the present invention. As shown in FIG. 1, the cascode connection circuit comprises FET1 (a first FET) having a source terminal connected to the ground, FET2 (a second FET) having a source terminal connected to a drain terminal of FET1, a resistor 6 (a first resistor) and a capacitor 3 (a first capacitor) connected in series between the source terminal of FET1 and a gate terminal of FET2, a resistor 4 (a second resistor) connected between a drain terminal of FET2 and the gate terminal of FET2, and a resistor 5 (a third resistor) connected in parallel to the capacitor 3, between the source terminal of FET1 and the gate terminal of FET2. Here, the gate terminal of FET1, the source terminal of FET1 and the drain terminal of FET2 function as a gate terminal 7, a source terminal 8 and a drain terminal 9 of the cascode connection circuit, respectively. Resistance values R1 and R2 of the resistors 4 and 5 are each 5-times or more the impedance $1/\omega C1$ of the capacitor 3 where C1 is a capacitance of the capacitor 3 and $\omega$ is angular frequency.

Figure 2:
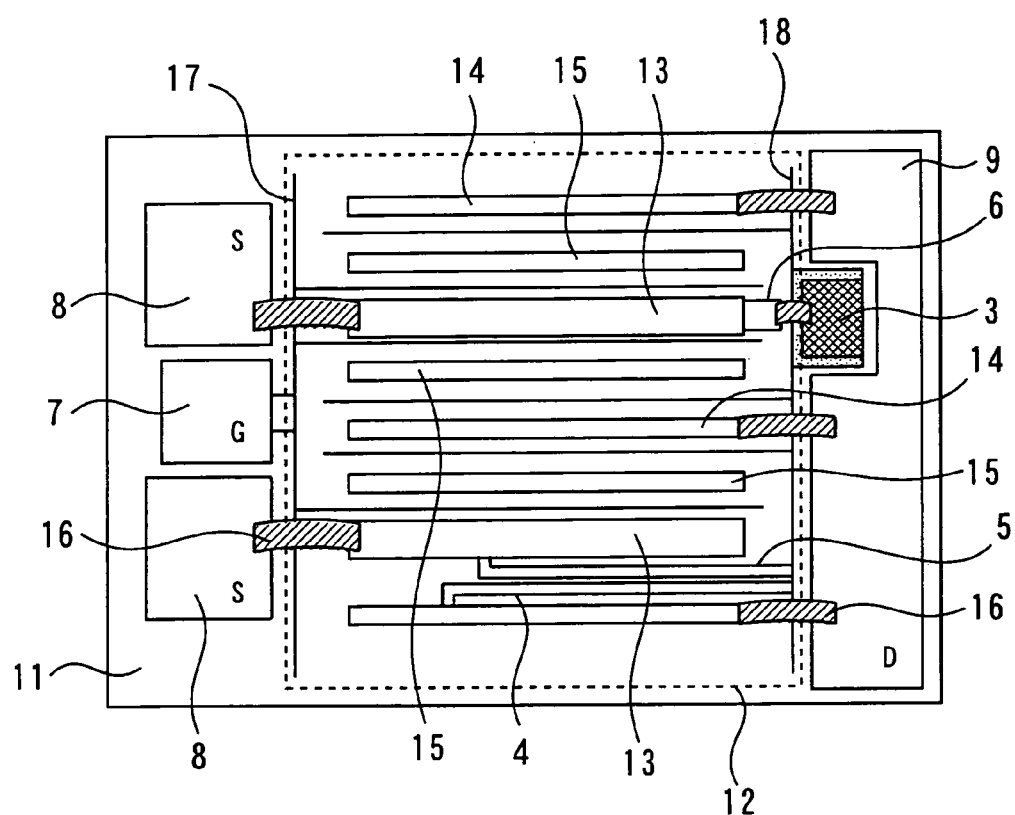
FIG. 2 is a top view showing an integrated circuit of the cascode connection circuit according to First Embodiment of the present invention.

FIG. 2 is a top view showing an integrated circuit of the cascode connection circuit according to First Embodiment of the present invention. There is shown an electrode pattern in which two FETs are connected in parallel on a substrate 11. The electrode pattern comprises two source terminals 8, a gate terminal 7, a drain terminal 9 and a cascode connection region 12. The two source terminals 8 and gate terminal 7 are disposed in the left end on the surface of the substrate 11, and the drain terminal 9 is disposed in the right end on the surface of the substrate 11. These electrodes are connected to the outside of the semiconductor device via a gold wire. The source terminal 8 may be connected to the ground electrode on the rear surface of the substrate via a via hole provided in the lower part of the source terminal 8. The cascode connection region 12 is sandwiched by these electrodes 7 to 9 and disposed in the center of the surface of the substrate 11.

The source electrodes 13 and the drain electrodes 14 of each FET are alternately arranged in the cascode connection region 12. The arrangement direction is perpendicular to a direction in which the source terminal 8 (the gate terminal 7) and the drain terminal 9 faces each other. The source electrode 13 and the drain electrode 14 are each rectangular, and the arrangement direction thereof is perpendicular to a longer side of the rectangular shape. As a connector to connect FET1 and FET2 in the cascode connection circuit, a floating electrode 15 is provided between the source electrode 13 and the drain electrode 14 of each FET. The source electrode 13 and the drain electrode 14 are connected, respectively, to the left side source terminal 8 and the right side drain terminal 9 via air bridges 16 overpass-crossing gate electrodes 17 and 18, respectively. Hereinafter, a cell constituted by one source electrode 13 and one drain electrode 14 adjacent to each other is referred to as an FET cell.

Further, the gate electrode 17 of FET1 and the gate electrode 18 of FET 2 are disposed in the cascode connection region 12. The gate electrodes 17 and 18 each have a comb configuration, and are each common to the two FETs. More specifically, the gate electrode 17 includes a straight portion existing along the source terminal 8 (the gate terminal 7) between the source terminal 8 (the gate terminal 7) and a plurality of FET cells, and a branched portion extending from the straight portion toward the space between the source electrode 13 and the floating electrode 15. The gate electrode 18 includes a straight portion existing along the drain terminal 9 between the drain terminal 9 and a plurality of FET cells, and a branched portion extending from the straight portion toward the space between the drain electrode 14 and the floating electrode 15. The gate electrode 17 is connected to the gate terminal 7 in the left end of the substrate 11.

A resistor 4 is provided to connect the lower side drain electrode 14 and the gate electrode 18, and a resistor 5 is provided to connect the lower side source electrode 13 and the gate electrode 18. Further, one end of a capacitor 3 is connected to the gate electrode 18, and the other end of the capacitor 3 is connected to a resistor 6 via an air bridge 16. The resistor 6 is connected to the source electrode 13. The capacitor 3 is composed of an MIM (metal-insulator-metal) capacitor, and the resistors 4 to 6 are each composed of an epitaxial resistor. Alternately, these elements may be composed by using other techniques such as gap capacitance, junction capacitance, injection resistance or wiring resistance.

Figure 3A:
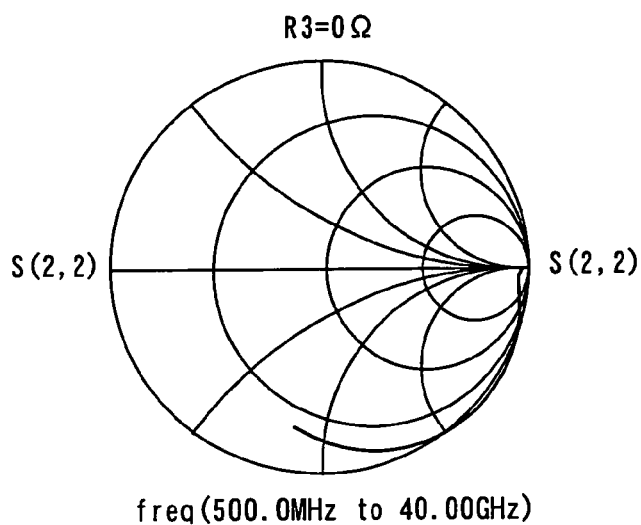
FIGS. 3A to 3C show the results of simulating S parameter of the cascode connection circuit.
Figure 3B:
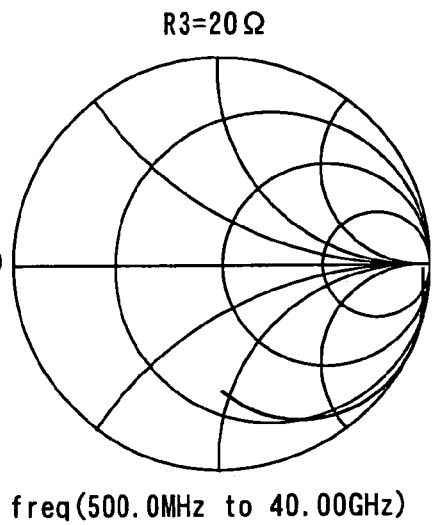
Figure 3C:
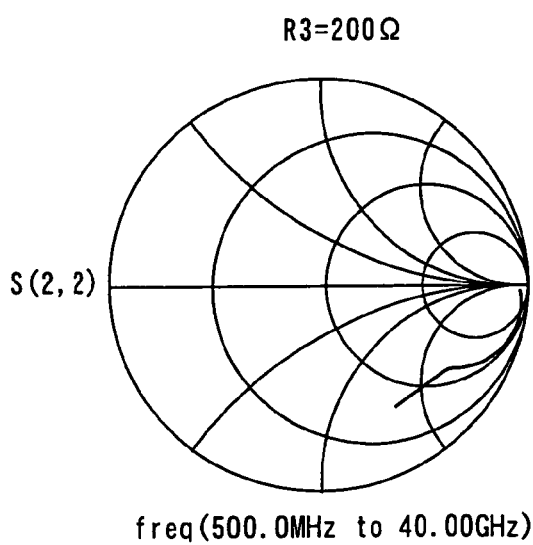

The results of simulating S parameter of the cascode connection circuit when resistance value R3 of the resistor 6 is set to 0Ω, 20Ω and 200Ω are shown in FIGS. 3A to 3C, respectively. Herein, capacitance C1 of the capacitor 3 is 0.2 pF, and operating frequency f is 3.0 GHz.

When resistance value R3 of the resistor 6 is set to 0Ω, S22 has a reflection gain, thus causing an unstable condition.

In contrast, when resistance value R3 of the resistor 6 is set to 20Ω or 200Ω, S22 has no reflection gain, thus improving stability.

Figure 4A:
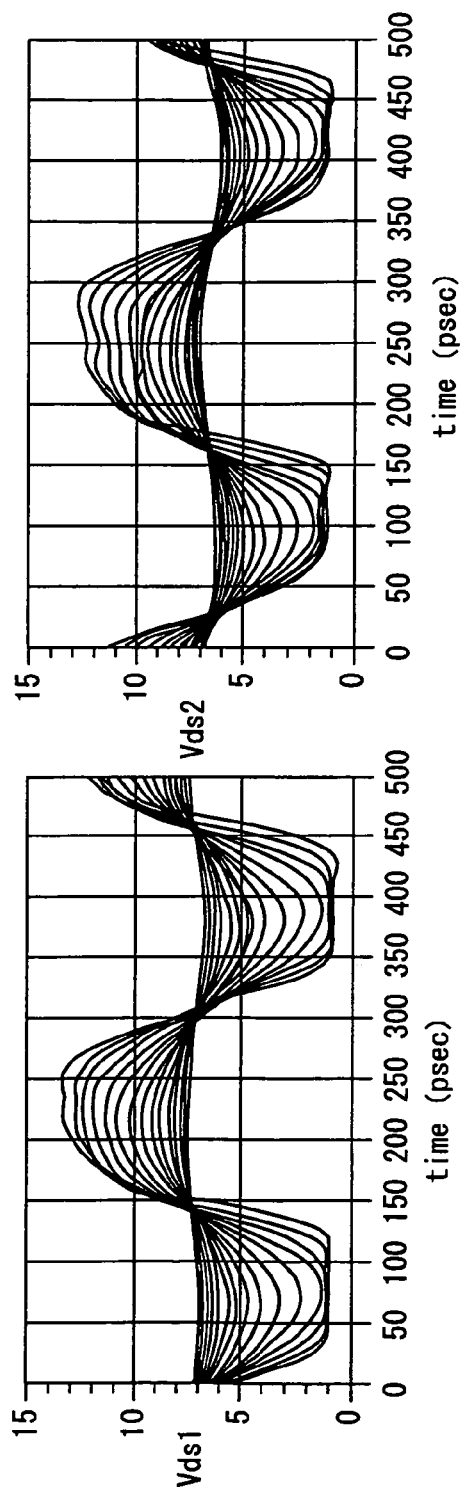
FIGS. 4A and 4B show the results of simulating the temporal waveform of drain/source voltages of two FETs.
Figure 4B:
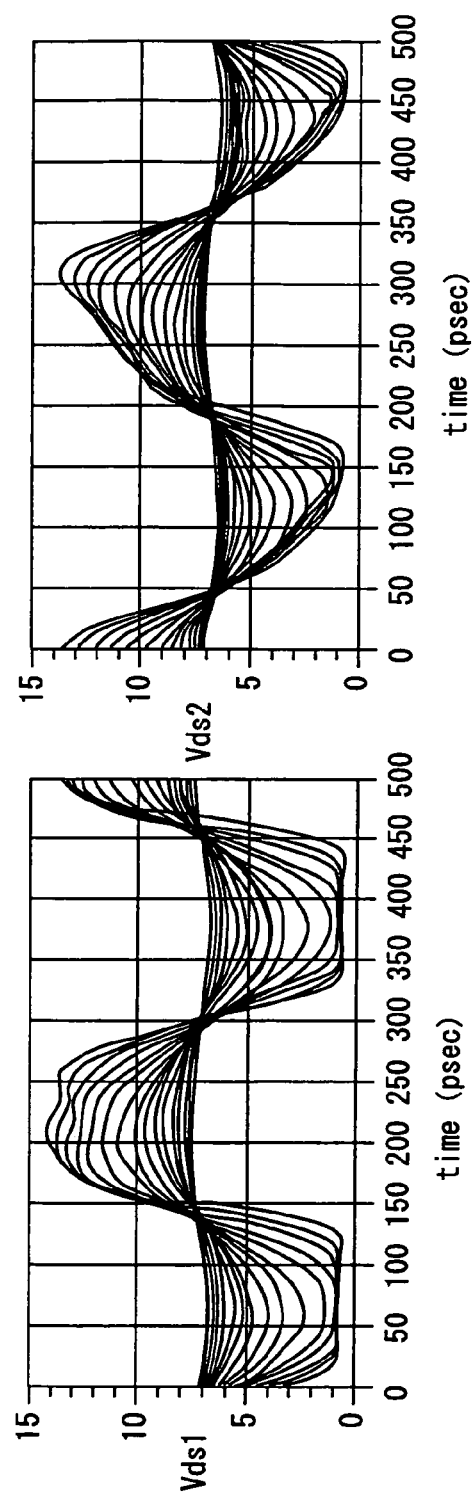

The results of simulating the temporal waveform of drain/source voltages Vds1 and Vds2 of FET1 and FET2 when R3 is set to 20Ω and 200Ω are shown in FIGS. 4A and 4B, respectively. Herein, capacitance C1 of the capacitor 3 is 0.2 pF, and operating frequency f is 3.0 GHz.

Here, in order to increase the output power of the cascode connection circuit, drain/source voltages Vds1 and Vds2 of FET1 and FET2 must have substantially the same phase and amplitude. However, when resistance value R3 of the resistor 6 is set to 200Ω, the temporal waveforms of drain/source voltages Vds1 and Vds2 of FET1 and FET2 are significantly different in phase. Accordingly, the amplitude of drain/source voltage Vds of the overall cascode connection circuit is reduced, thus lowering the output power.

In contrast, when resistance value R3 of the resistor 6 is set to 20Ω, drain/source voltages Vds1 and Vds2 of FET1 and FET2 have substantially the same phase and amplitude. Accordingly, the amplitude of drain/source voltage Vds of the overall cascode connection circuit is increased. Thus the output power can be prevented from being lowered.

Resistance value R3 of the resistor 6 is arbitrarily set to a range implementing C1R3<<1/f, because it is sufficient for the RF voltage of the gate terminal of FET2 to follow operating frequency f at a sufficiently high rate. Specifically, a setting is made so that the product C1R3 of resistance value R3 of the resistor 6 and capacitance value C1 of the capacitor 3 is 0.1 times or less of a period corresponding to operating frequency f.

In the cascode connection circuit according to the present invention, by virtue of provision of the resistor 6, part of the RF power applied to the gate terminal of FET2 is consumed. Operational stability can thus be improved without deteriorating gain, output power and efficiency.

Figure 5:
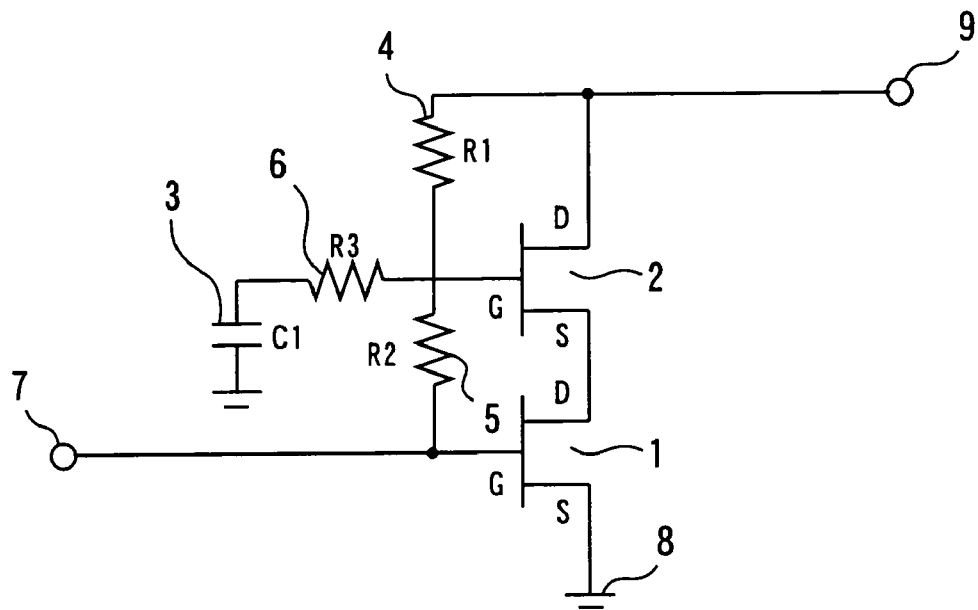
FIG. 5 is a circuit diagram showing another exemplary cascode connection circuit according to First Embodiment of the present invention.

In the above example, the resistor 5 is connected in parallel to the capacitor 3, between the source terminal of FET1 and the gate terminal of FET2. However, as shown in FIG. 5, the resistor 5 may be connected between the gate terminal of FET 1 and the gate terminal of FET2.

Second Embodiment

Figure 6:
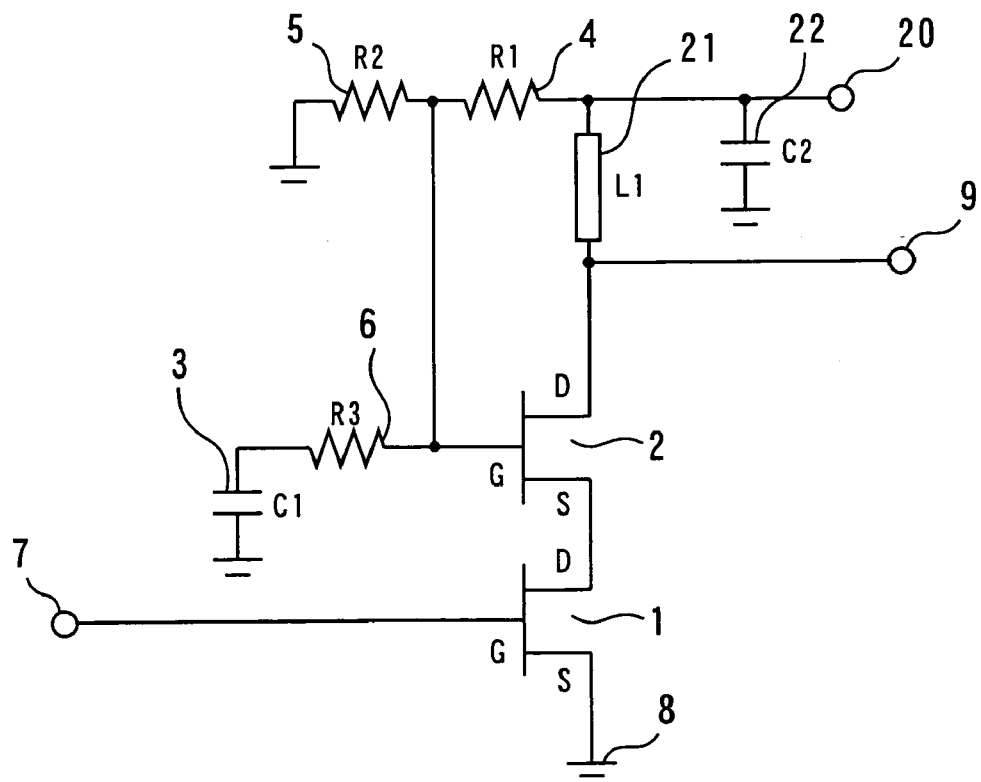
FIG. 6 is a circuit diagram showing a cascode connection circuit according to Second Embodiment of the present invention.

FIG. 6 is a circuit diagram showing a cascode connection circuit according to Second Embodiment of the present invention. As shown in FIG. 6, the cascode connection circuit includes: a micro strip line 21 (a first micro strip line) having one end connected to the drain terminal of FET2; a capacitor 22 (a second capacitor) which is connected between the other end of the micro strip line 21 and the source terminal of FET1 and of which the impedance is shunted at the operational frequency; a resistor 4 connected between the other end of the micro strip line 21 and the gate terminal of FET2; a resistor 5 connected in parallel to the resistor 6 and capacitor 3, between the source terminal of FET1 and the gate terminal of FET2. In other aspects, the configuration of Second Embodiment is similar to that of First Embodiment.

The drain bias of the cascode connection circuit is applied from a drain bias terminal 20 via the capacitor 22 and the micro strip line 21. The RF signal is shorted by the capacitor 22 at the operational frequency, whereby the output RF signal does not leak to the resistors 4 and 5. Accordingly, the output and efficiency of the semiconductor device can be increased.

Figure 7:
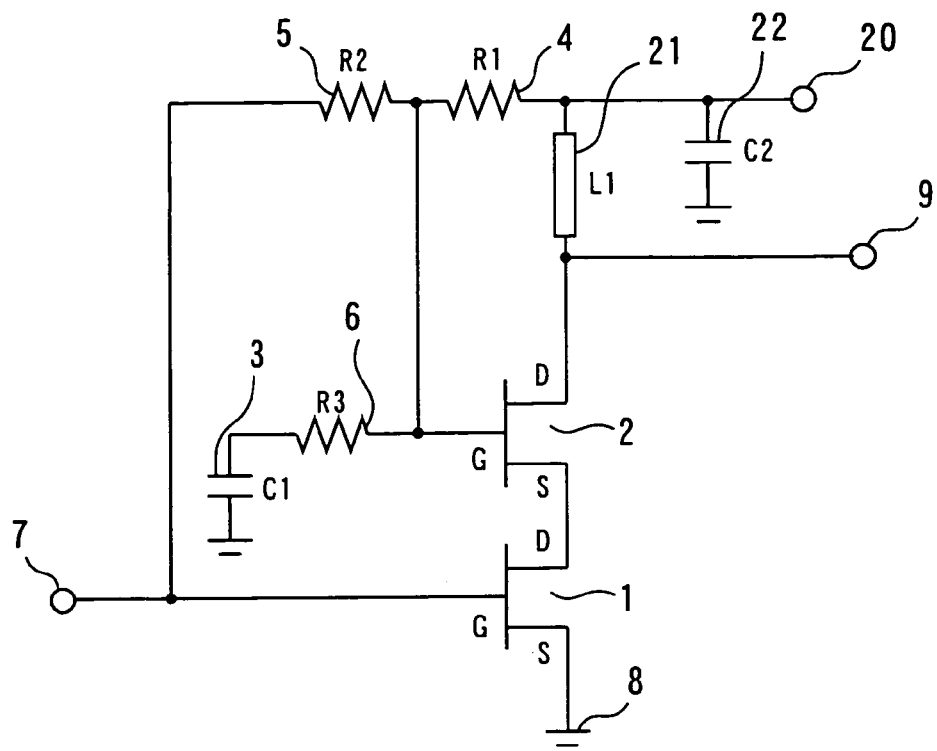
FIG. 7 is a circuit diagram showing another exemplary cascode connection circuit according to Second Embodiment of the present invention.
Figure 8:
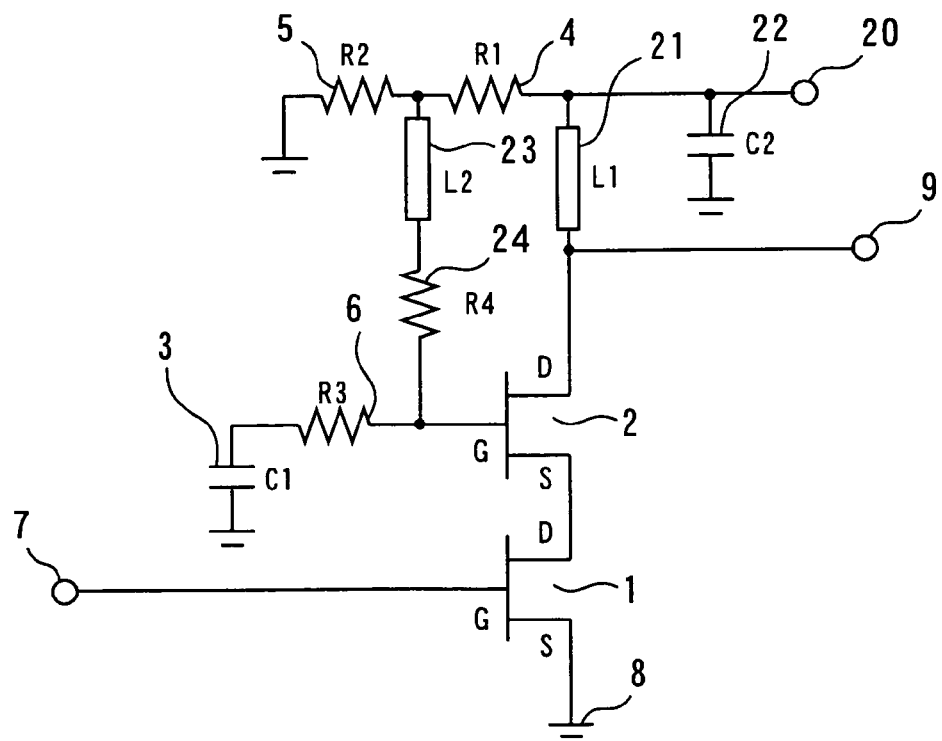
FIG. 8 is a circuit diagram showing another exemplary cascode connection circuit according to Second Embodiment of the present invention.

Instead of the micro strip line 21, a coplanar line or an inductor may be used. In the above example, the resistor 5 is connected in parallel to the capacitor 3, between the source terminal of FET1 and the gate terminal of FET2. However, as shown in FIG. 7, the resistor 5 may be connected between the gate terminal of FET1 and the gate terminal of FET2. Also, in the above example, the connection point between the resistors 4 and 5 is directly connected to the gate electrode of FET2. However, as shown in FIG. 8, the connection point may be connected via a micro strip line 23 and a resistor 24. Herein, resistance value R4 of the resistor 24 is set to several hundreds Q or more.

Third Embodiment

Figure 9:
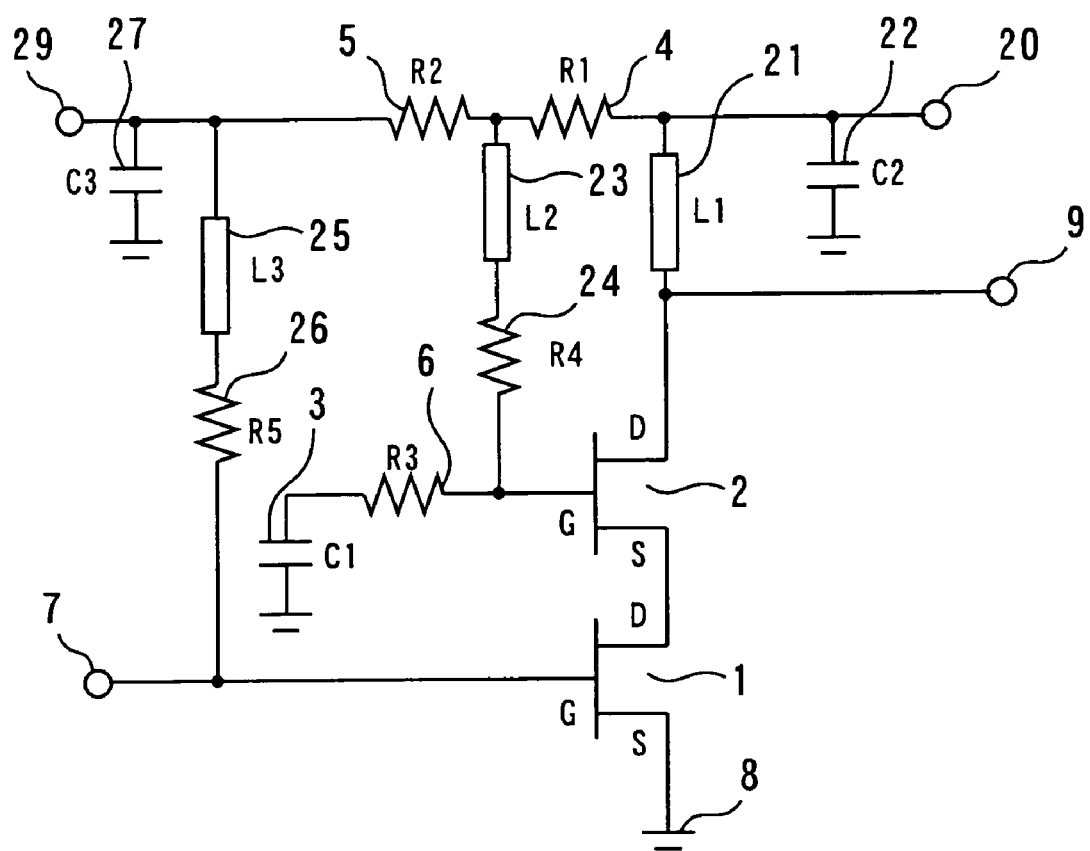
FIG. 9 is a circuit diagram showing a cascode connection circuit according to Third Embodiment of the present invention.

FIG. 9 is a circuit diagram showing a cascode connection circuit according to Third Embodiment of the present invention. As shown in FIG. 9, the cascode connection circuit includes: a micro strip line 25 (a second micro strip line) having one end connected to the gate terminal of FET1 via a resistor 26; and a capacitor 27 (a third capacitor) connected between the other end of the micro strip line 25 and the source terminal of FET1. The resistor 5 is connected between the other end of the micro strip line 25 and the source terminal of FET1. A gate bias terminal 29 is additionally provided. In other aspects, the configuration of Third Embodiment is similar to that of the cascode connection circuit shown in FIG. 8.

The DC bias voltage for the gate electrode of FET1 is applied from the gate bias terminal 29 via the micro strip line 25 and the capacitor 27 of which the impedance is shunted at the operational frequency. Accordingly, the resistance value of the resistors 4 and 5 for creating the gate voltage of FET2, separated from the RF signal by the capacitor 27, can be unrestrainedly set. Thus the degree of freedom in designing and process selection can be improved.

The micro strip lines 23 and 24 are not always necessary. Also, one of the micro strip lines 25 and 26 may be omitted.

Fourth Embodiment

Figure 10:
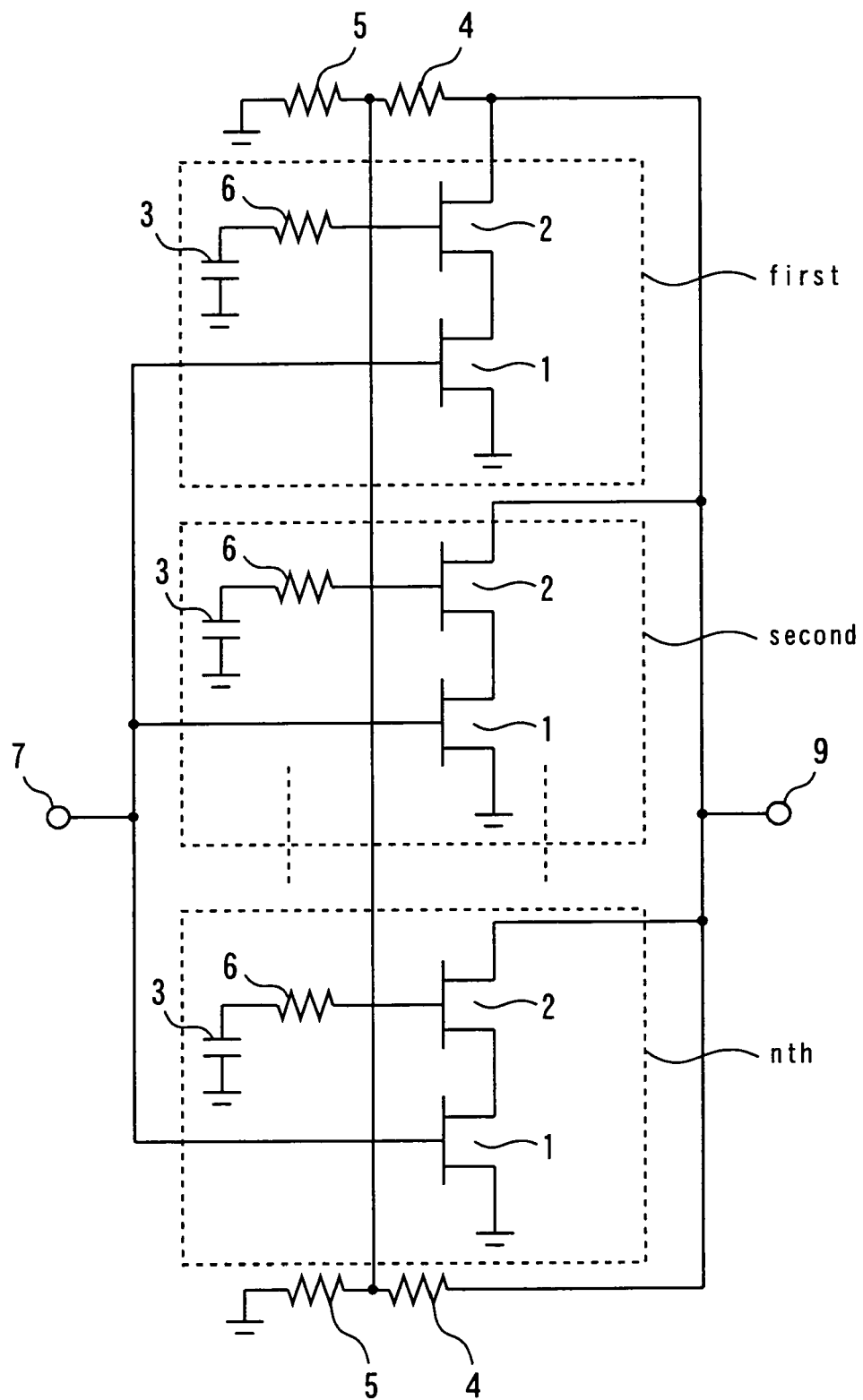
FIG. 10 is a circuit diagram showing a cascode connection circuit according to Fourth Embodiment of the present invention.

FIG. 10 is a circuit diagram showing a cascode connection circuit according to Fourth Embodiment of the present invention. As shown in FIG. 10, the cascode connection circuit has a plurality of the cascode connection circuits shown in FIG. 1 connected in parallel to each other, so that a high output can be achieved. Herein, a plurality of the other cascode connection circuits according to First, Second or Third Embodiment may be connected in parallel.

Here, when a plurality of the conventional cascode connection circuits are connected in parallel, distributed-constant circuit components cannot be neglected. Consequently, each of the cascode connection circuits does not operate similarly, thus causing a problem. In contrast, according to the present embodiment, the gate electrodes of FET2 of each cascode connection circuit each have disposed therein a series circuit composed of the capacitor 3 and resistor 6. Accordingly, the gate electrode impedances of FET2 of each FET cell can be maintained at an equal value. Thus each FET cell can be made to operate similarly. Also, the capacitors 3 are RF-shunted in a high frequency range of the operational frequency or higher, so each of the FET2 gate electrode is equivalently connected to the ground via the resistor 6. Consequently, loop oscillation can also be suppressed.

Figure 11:
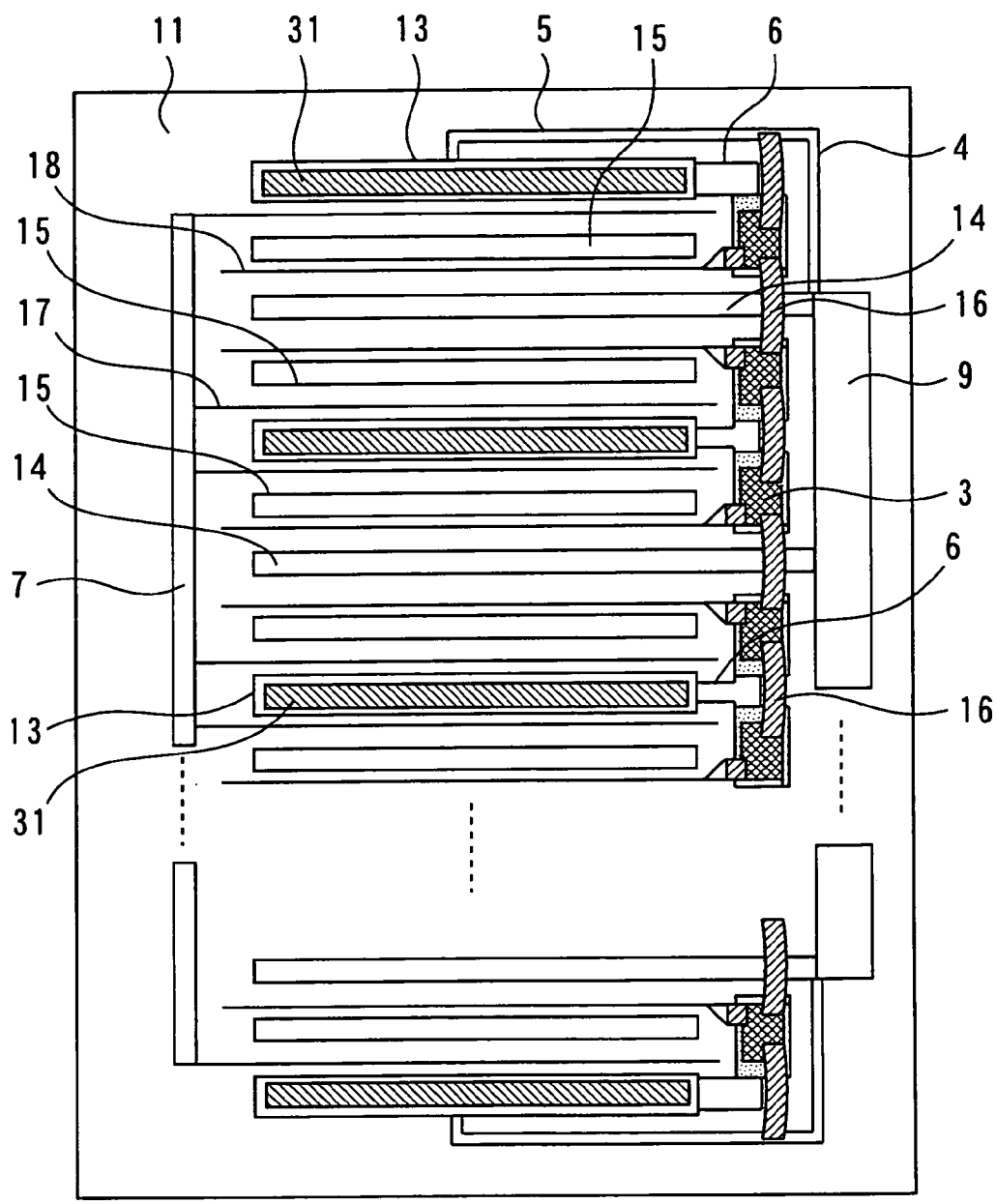
FIG. 11 is a top view showing an integrated circuit of the cascode connection circuit according to Fourth Embodiment of the present invention.

FIG. 11 is a top view showing an integrated circuit of the cascode connection circuit according to Fourth Embodiment of the present invention. The same reference numerals are applied to constituent components corresponding to FIG. 2, and an explanation thereof is omitted.

A capacitor 3 is provided for each gate electrode 18 of FET2, and the capacitors 3 are connected to each other via an air bridge 16. The FET2 gate electrodes of each FET cell are connected to each other via an air bridge 16, whereby the DC bias can be applied to the FET2 gate electrodes all at once. The source electrode 13 is connected to the rear-surface ground electrode via a bias hole 31 for each FET cell, thereby reducing source inductance.

Figure 12:
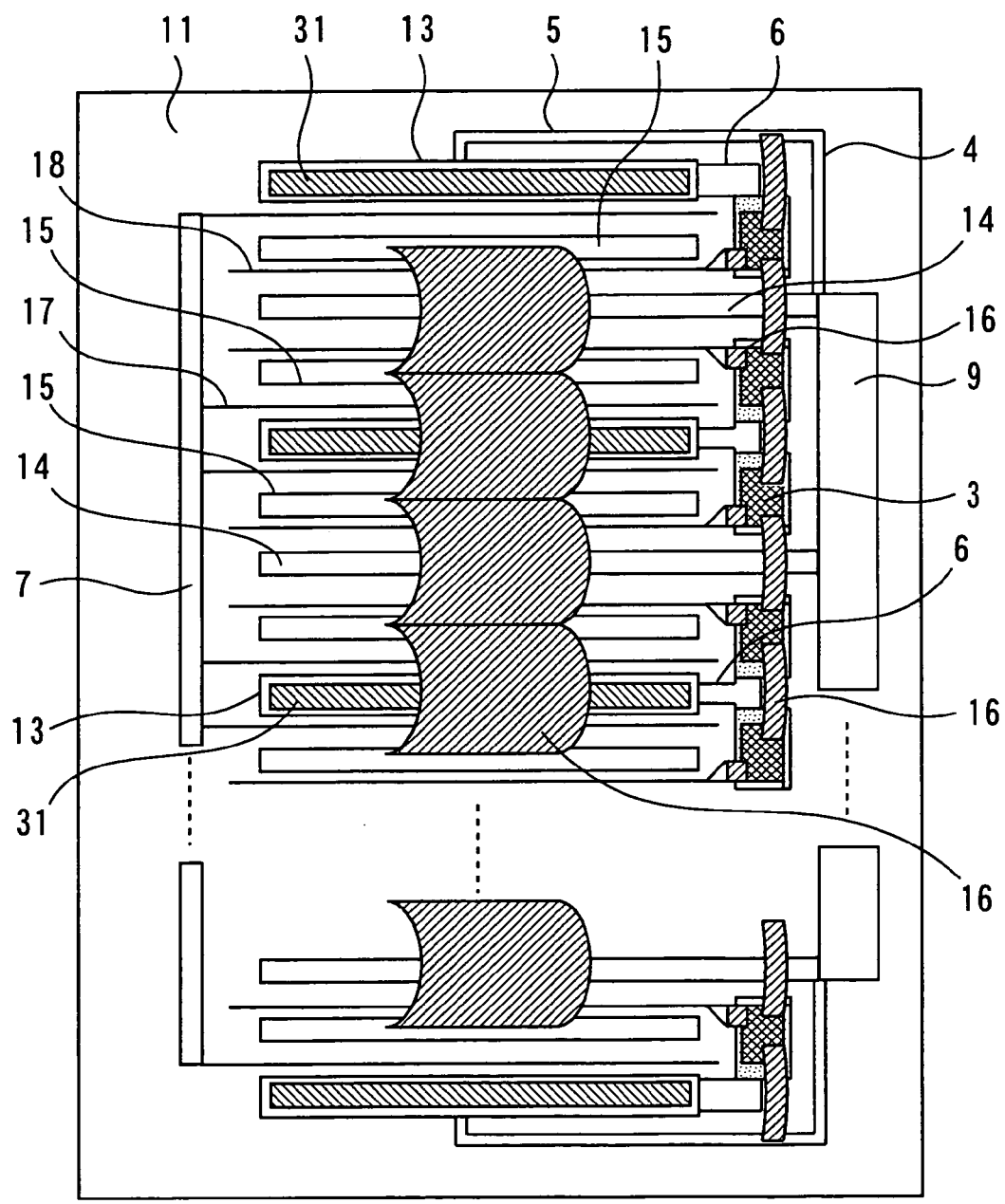
FIG. 12 is a top view showing another exemplary integrated circuit of the cascode connection circuit according to Fourth Embodiment of the present invention.

FIG. 12 is a top view showing another exemplary integrated circuit of the cascode connection circuit according to Fourth Embodiment of the present invention. The floating electrodes 15 of each FET cell are connected to each other via an air bridge 16, whereby each FET cell operates similarly.

Figure 13:
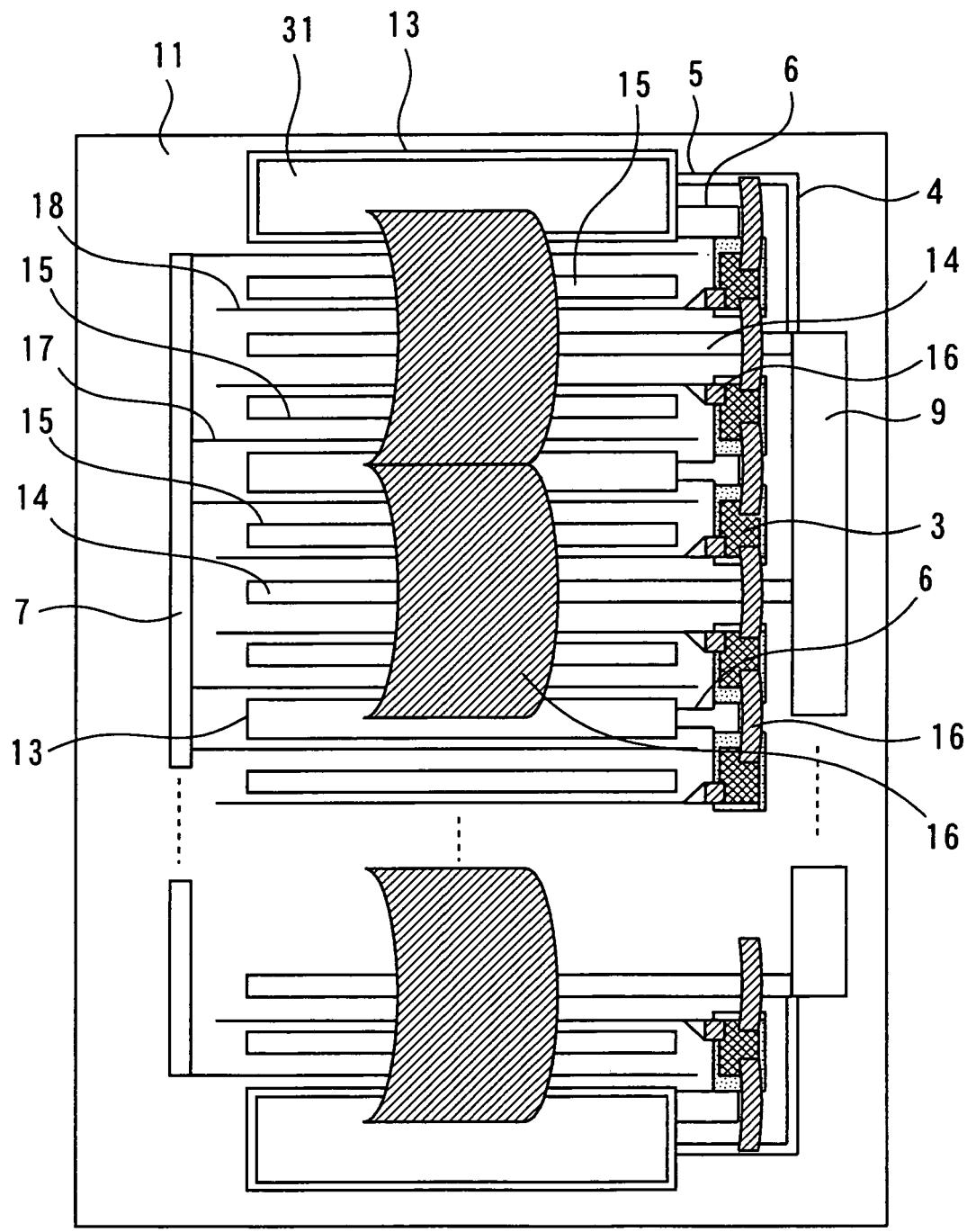
FIG. 13 is a top view showing another exemplary integrated circuit of the cascode connection circuit according to Fourth Embodiment of the present invention.
Figure 14:
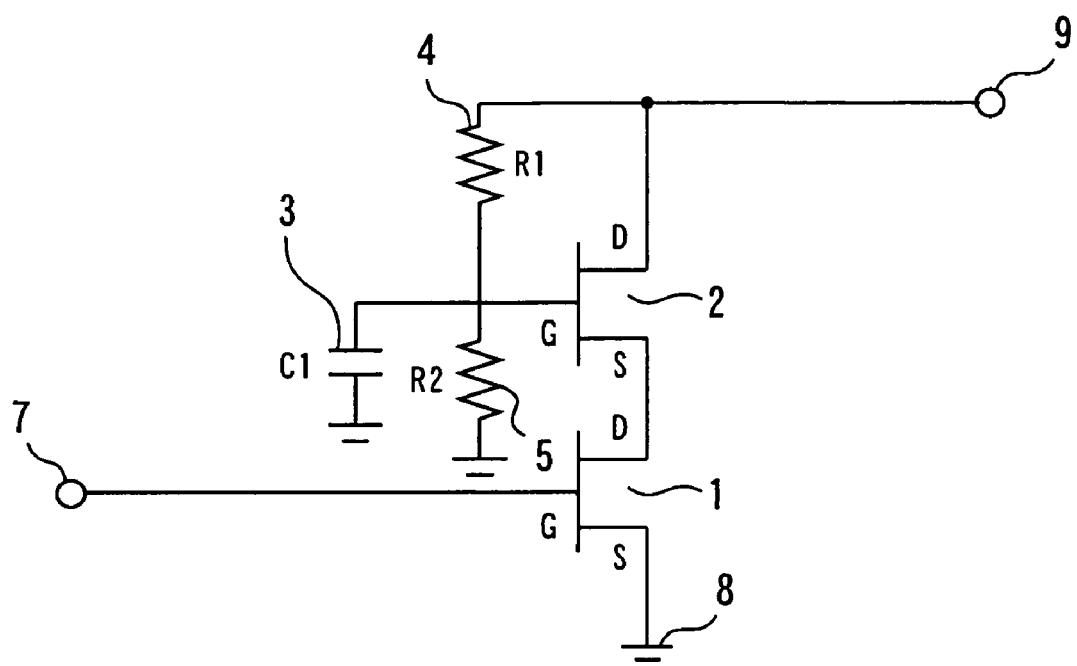
FIG. 14 is a circuit diagram showing a conventional cascode connection circuit.

FIG. 13 is a top view showing another exemplary integrated circuit of the cascode connection circuit according to Fourth Embodiment of the present invention. The source electrodes 13 of each FET cell are connected to each other via an air bridge 16, and connected to the rear-surface ground electrode all at one through via holes 31 disposed at both ends of the cascode connection circuit. Accordingly, compared to a configuration in which a via hole is provided for each source electrode 13, downsizing is possible, and a lower cost semiconductor device can be implemented.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-245251, filed on Aug. 26, 2005 including specification, claims, drawings and summary, on which the Convention priority of the present application is based, are incorporated herein by reference in its entirety.

What is claimed is:

1. A cascode connection circuit comprising:
    a first field effect transistor (FET) which has a source terminal, a gate terminal, and a drain terminal, the source terminal being connected to ground;
    a second FET which has a source terminal, a gate terminal, and a drain terminal, the source terminal being connected to the drain terminal of the first FET;
    a first resistor having a resistance and a first capacitor having a capacitance connected in series between the source terminal of the first FET and the gate terminal of the second FET, wherein,
        the first FET and the second FET are cascode-connected to each other, and
        the product of the resistance of the first resistor and the capacitance of the first capacitor does not exceed 0.1 times the period of an operating frequency of the circuit;
    a second resistor connected between the drain terminal of the second FET and the gate terminal of the second FET; and
    a third resistor connected in parallel with the first resistor and first capacitor, between the source terminal of the first FET and the gate terminal of the second FET.

2. A cascode connection circuit comprising:
    a first field effect transistor (FET) which has a source terminal, a gate terminal, and a drain terminal, the source terminal being connected to ground;
    a second FET which has a source terminal, a gate terminal, and a drain terminal, the source terminal being connected to the drain terminal of the first FET;

a first resistor having a resistance and a first capacitor having a capacitance connected in series between the source terminal of the first FET and the gate terminal of the second FET, wherein,
the first FET and the second FET are cascode-connected to each other, and
the product of the resistance of the first resistor and the capacitance of the first capacitor does not exceed 0.1 times the period of an operating frequency of the circuit;
a second resistor connected between the drain terminal of the second FET and the gate terminal of the second FET and
a third resistor connected between the gate terminal of the first FET and the gate terminal of the second FET.

3. A cascode connection circuit comprising:
a first field effect transistor (FET) which has a source terminal, a gate terminal, and a drain terminal, the source terminal being connected to ground;
a second FET which has a source terminal, a gate terminal, and a drain terminal, the source terminal being connected to the drain terminal of the first FET;
a first resistor having a resistance and a first capacitor having a capacitance connected in series between the source terminal of the first FET and the gate terminal of the second FET, wherein,
the first FET and the second FET are cascode-connected to each other, and
the product of the resistance of the first resistor and the capacitance of the first capacitor does not exceed 0.1 times the period of an operating frequency of the circuit;
a micro strip line having a first end connected to the drain terminal of the second FET;
a second capacitor connected between a second end of the micro strip line and the source terminal of the first FET;
a second resistor connected between the second end of the micro strip line and the gate terminal of the second FET; and
a third resistor connected in parallel with the first resistor and first capacitor, between the source terminal of the first FET and the gate terminal of the second FET.

4. A cascode connection circuit comprising:
a first field effect transistor (FET) which has a source terminal, a gate terminal, and a drain terminal, the source terminal being connected to ground;
a second FET which has a source terminal, a gate terminal, and a drain terminal, the source terminal being connected to the drain terminal of the first FET;
a first resistor having a resistance and a first capacitor having a capacitance connected in series between the source terminal of the first FET and the gate terminal of the second FET, wherein,
the first FET and the second FET are cascode-connected to each other, and
the product of the resistance of the first resistor and the capacitance of
the first capacitor does not exceed 0.1 times the period of an operating frequency of the circuit;
a micro strip line having a first end connected to the drain terminal of the second FET;
a second capacitor connected between a second end of the micro strip line and the source terminal of the first FET;
a second resistor connected between the second end of the micro strip line and the gate terminal of the second FET; and
a third resistor connected between the gate terminal of the first FET and the gate terminal of the second FET.

5. A cascode connection circuit comprising:
a first field effect transistor (FET) which has a source terminal, a gate terminal, and a drain terminal, the source terminal being connected to ground;
a second FET which has a source terminal, a gate terminal, and a drain terminal, the source terminal being connected to the drain terminal of the first FET;
a first resistor having a resistance and a first capacitor having a capacitance connected in series between the source terminal of the first FET and the gate terminal of the second FET, wherein,
the first FET and the second FET are cascode-connected to each other, and
the product of the resistance of the first resistor and the capacitance of
the first capacitor does not exceed 0.1 times the period of an operating frequency of the circuit;
a first micro strip line having a first end connected to the drain terminal of the second FET;
a second capacitor connected between a second end of the first micro strip line and the source terminal of the first FET;
a second resistor connected between the second end of the first micro strip line and the gate terminal of the second FET;
a second micro strip line having a first end connected to the gate terminal of the first FET; and
a third capacitor connected between a second end of the second micro strip line and the source terminal of the first FET; and
a third resistor connected between the second end of the second micro strip line and the gate terminal of the second FET.

6. A cascode connection circuit comprising a plurality of cascode connection circuits according to claim 1, connected in parallel to each other.

7. A cascode connection circuit comprising a plurality of cascode connection circuits according to claim 2, connected in parallel to each other.

8. A cascode connection circuit comprising a plurality of cascode connection circuits according to claim 3, connected in parallel to each other.

9. A cascode connection circuit comprising a plurality of cascode connection circuits according to claim 4, connected in parallel to each other.

10. A cascode connection circuit comprising a plurality of cascode connection circuits according to claim 5, connected in parallel to each other.

* * * * *